US012685200B2

(12) United States Patent
Kim et al.

(10) Patent No.: US 12,685,200 B2
(45) Date of Patent: Jul. 14, 2026

(54) SEMICONDUCTOR PACKAGE

(71) Applicant: Samsung Electronics Co., Ltd.,
Suwon-si (KR)

(72) Inventors: Tae Yeong Kim, Suwon-si (KR); **Jun
Hong Min, Suwon-si (KR); Eun Suk
Jung, Suwon-si (KR); So Hye Cho**,
Suwon-si (KR)

(73) Assignee: Samsung Electronics Co., Ltd.,
Suwon-si (KR)

( * ) Notice: Subject to any disclaimer, the term of this
patent is extended or adjusted under 35
U.S.C. 154(b) by 398 days.

(21) Appl. No.: 18/524,454

(22) Filed: Nov. 30, 2023

(65) Prior Publication Data

US 2024/0213138 A1 Jun. 27, 2024

(30) Foreign Application Priority Data

Dec. 22, 2022 (KR) ........................ 10-2022-0181439

(51) Int. Cl.
*H10W 70/69* (2026.01)
*H10W 70/65* (2026.01)
(Continued)

(52) U.S. Cl.
CPC ........... *H10W 70/69* (2026.01); *H10W 70/65*
(2026.01); *H10W 70/685* (2026.01);
(Continued)

(58) Field of Classification Search
CPC ... H10W 70/69; H10W 70/65; H10W 70/685;
H10W 70/698; H10W 72/353; H10W 72/355; H10W 74/15; H10W 90/724;
H10W 90/734; H10W 72/073; H10W
72/20; H10W 72/90; H10W 80/701;
(Continued)

(56) References Cited

U.S. PATENT DOCUMENTS 6,872,979 B2 3/2005 Yoshida et al.
7,598,153 B2 10/2009 Henley et al.
(Continued)

OTHER PUBLICATIONS

European Search Report for European Application No. 23201306.0
dated Mar. 28, 2024.
(Continued)

*Primary Examiner* — Victor A Mandala
(74) *Attorney, Agent, or Firm* — Harness, Dickey &
Pierce, P.L.C.

(57) ABSTRACT

A semiconductor package includes a first substrate including
silicon, a first insulating layer in contact with the first
substrate, the first insulating layer including silicon oxide,
the first insulating layer having a first concentration of
silicon, a second insulating layer in contact with the first
insulating layer, the second insulating layer including silicon
oxide, the second insulating layer having a second concen-
tration of silicon, the second concentration lower than the
first concentration, and a structure on the second insulating
layer. The first concentration is a ratio of a weight of silicon
in the first insulating layer to a total weight of the first
insulating layer, the second concentration is a ratio of a
weight of silicon in the second insulating layer to a total
weight of the second insulating layer, and the first concen-
tration is in a range from 20 wt % to 50 wt %.

20 Claims, 20 Drawing Sheets

(51) Int. Cl.

| | |
|---|---|
| *H10W 70/685* | (2026.01) |
| *H10W 70/698* | (2026.01) |
| *H10W 72/30* | (2026.01) |
| *H10W 74/15* | (2026.01) |
| *H10W 90/00* | (2026.01) |

(52) U.S. Cl.
CPC ........ *H10W 70/698* (2026.01); *H10W 72/353* (2026.01); *H10W 72/355* (2026.01); *H10W 74/15* (2026.01); *H10W 90/724* (2026.01); *H10W 90/734* (2026.01)

(58) Field of Classification Search
CPC ............. H10W 90/794; H10W 10/181; H10W 20/484; H10W 20/40; H10W 72/019; H10W 70/05; H10W 70/60; H10W 70/652; H10P 90/1914; H10P 10/12; H10P 14/69215; H10D 86/201
See application file for complete search history.

(56) References Cited

U.S. PATENT DOCUMENTS

| | | | |
|---|---|---|---|
| 7,682,761 | B2 | 3/2010 | Gao et al. |
| 9,117,686 | B2 | 8/2015 | Gaudin |
| 10,283,401 | B2 | 5/2019 | Ishikawa et al. |
| 11,342,185 | B2 | 5/2022 | Guo et al. |
| 11,479,515 | B2 * | 10/2022 | Luthra .................. C04B 41/009 |
| 12,176,278 | B2 * | 12/2024 | Yang ................... H10W 70/611 |
| 2014/0342528 | A1 | 11/2014 | Sabbione et al. |
| 2018/0331230 | A1 * | 11/2018 | Kudo ................. H10D 30/6758 |
| 2019/0194337 | A1 | 6/2019 | Ling et al. |
| 2021/0335745 | A1 | 10/2021 | Chen et al. |
| 2022/0149002 | A1 | 5/2022 | Hou et al. |
| 2022/0344301 | A1 | 10/2022 | Yu et al. |
| 2024/0153770 | A1 * | 5/2024 | Liu ......................... H10P 50/73 |

OTHER PUBLICATIONS

Office Action for European Application No. 23201306.0 dated Apr. 9, 2024.

* cited by examiner

Heat 450
430
110
100

SEMICONDUCTOR PACKAGE

CROSS-REFERENCE TO RELATED APPLICATION

This application claims priority from Korean Patent Application No. 10-2022-0181439 filed on Dec. 22, 2022 in the Korean Intellectual Property Office, and all the benefits accruing therefrom under 35 U.S.C. 119, the contents of which in its entirety are herein incorporated by reference.

FIELD

Some example embodiments of the inventive concepts relate to a semiconductor package.

BACKGROUND

A weight ratio of silicon included in an insulating material used for bonding of a wafer may be less than 20%. While a bonding process of the wafer is being performed, $H_2O$ generated according to a surface treatment condition, a heat treatment condition after the wafer bonding, and the like, may generate voids in a bonding joint surface. The voids formed on the bonding joint surface of the wafer may cause a delamination on the bonding joint surface of the wafer. Therefore, in order to improve the reliability of the wafer bonding, it is desirable or necessary to inhibit or prevent the occurrence of voids on the bonding joint surface of the wafer.

SUMMARY

Some example embodiments of the inventive concepts provide a semiconductor package in which a bonding reliability of a substrate is improved.

However, the inventive concepts are not restricted to the ones set forth herein. The above and other inventive concepts will become more apparent to one of ordinary skill in the art by referencing the detailed description of example embodiments given below.

According to some example embodiments of the inventive concepts, a semiconductor package includes a first substrate including silicon, a first insulating layer in contact with the first substrate on the first substrate, the first insulating layer including silicon oxide, the first insulating layer having a first concentration of silicon, a second insulating layer in contact with the first insulating layer on the first insulating layer, the second insulating layer including silicon oxide, the second insulating layer having a second concentration of silicon, the second concentration lower than the first concentration, and a structure on the second insulating layer, wherein the first concentration is a ratio of a weight of silicon in the first insulating layer to a total weight of the first insulating layer, wherein the second concentration is a ratio of a weight of silicon in the second insulating layer to a total weight of the second insulating layer, and wherein the first concentration is in a range from 20 wt % to 50 wt %.

According to some example embodiments of the inventive concepts, a semiconductor package including a first substrate including silicon, a first insulating layer in contact with the first substrate on the first substrate, the first insulating layer including silicon oxide, the first insulating layer having a first concentration of silicon, a second insulating layer in contact with the first insulating layer on the first insulating layer, the second insulating layer including silicon oxide, the second insulating layer having a second concentration of silicon, the second concentration lower than the first concentration, a third insulating layer in contact with the second insulating layer on the second insulating layer, the third insulating layer including silicon oxide, the third insulating layer having a third concentration of silicon, the third concentration higher than the second concentration, and a structure disposed on the third insulating layer, wherein the first concentration is a ratio of a weight of silicon included in the first insulating layer to a total weight of the first insulating layer, wherein the second concentration is a ratio of a weight of silicon included in the second insulating layer to a total weight of the second insulating layer, and wherein the third concentration is a ratio of a weight of silicon included in the third insulating layer to a total weight of the third insulating layer.

According to some example embodiments of the inventive concepts, a semiconductor package includes a first substrate including silicon, a first insulating layer in contact with the first substrate on the first substrate, the first insulating layer including silicon oxide, the first insulating layer having a first concentration of silicon, a second insulating layer in contact with the first insulating layer on the first insulating layer, the second insulating layer including silicon oxide, the second insulating layer having a second concentration of silicon, the second concentration lower than the first concentration, a third insulating layer in contact with the second insulating layer on the second insulating layer, the third insulating layer including silicon oxide, the third insulating layer having a third concentration of silicon, the third concentration higher than the second concentration, and a second substrate in contact with the third insulating layer on the third insulating layer, the second substrate including silicon, wherein the first concentration is a ratio of a weight of silicon included in the first insulating layer to a total weight of the first insulating layer, wherein the second concentration is a ratio of a weight of silicon included in the second insulating layer to a total weight of the second insulating layer, wherein the third concentration is a ratio of a weight of silicon included in the third insulating layer to a total weight of the third insulating layer, wherein a thickness of the second insulating layer is smaller than each of a thickness of the first insulating layer and a thickness of the third insulating layer, wherein each of the first concentration and the third concentration is in a range from 20 wt % to 50 wt %, and wherein the second concentration is in a range from 5 wt % to 20 wt %.

BRIEF DESCRIPTION OF THE DRAWINGS

The above and other features of the inventive concepts will become more apparent by describing in detail example embodiments thereof with reference to the attached drawings, in which:

FIG. 1 is a diagram for explaining a semiconductor package according to some example embodiments of the inventive concepts;

FIGS. 8 to 10 are intermediate step diagrams for explaining the method of manufacturing the semiconductor package shown in FIG. 6;

FIG. 11 is a diagram for explaining a semiconductor package according to some other example embodiments of the inventive concepts;

FIGS. 15 to 17 are intermediate step diagrams for explaining the method of manufacturing the semiconductor package shown in FIG. 13;

FIGS. 20 to 22 are intermediate step diagrams for explaining the method of manufacturing the semiconductor package shown in FIG. 18;

FIG. 23 is a diagram for explaining a semiconductor package according to some other example embodiments of the inventive concepts.

DETAILED DESCRIPTION

A semiconductor package according to some example embodiments of the inventive concepts will be explained below with reference to FIGS. 1 and 2.

Figure 1:
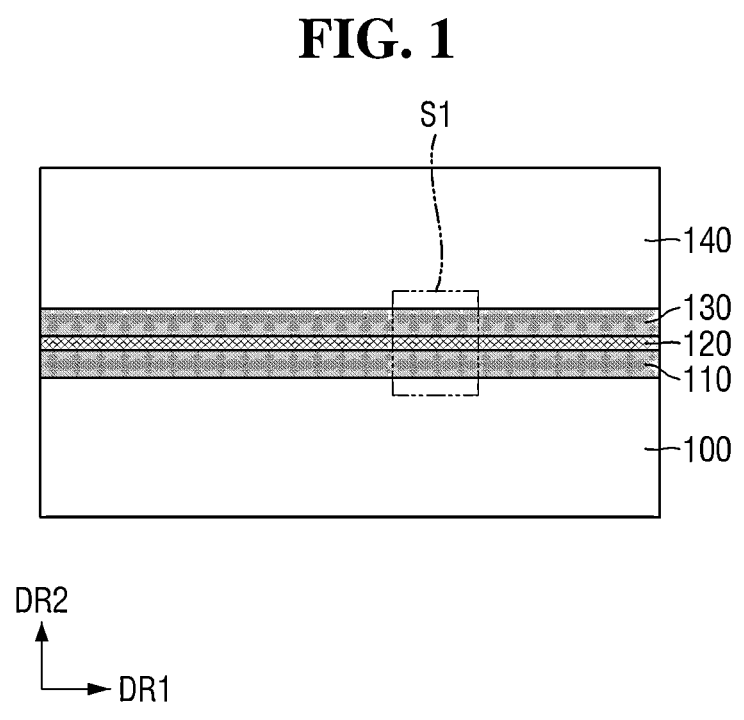

FIG. 1 is a diagram for explaining a semiconductor package according to some example embodiments of the inventive concepts. FIG. 2 is an enlarged view of a region S1 of FIG. 1.

Figure 2:
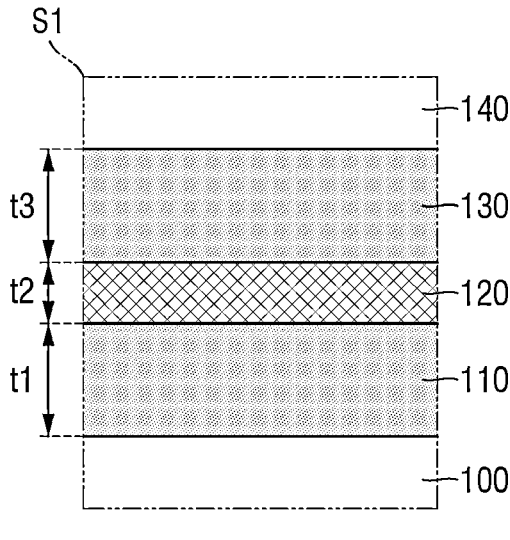
FIG. 2 is an enlarged view of a region S1 of FIG. 1.
Figure 2:
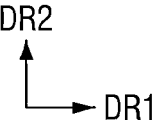

Referring to FIGS. 1 and 2, a semiconductor package according to some example embodiments of the inventive concepts includes a first substrate 100, a first insulating layer 110, a second insulating layer 120, a third insulating layer 130, and a second substrate 140.

For example, the first substrate 100 may be a wafer. The first substrate 100 may include silicon. That is, the first substrate 100 may be a silicon substrate. However, the inventive concepts are not limited thereto. In some other example embodiments, the first substrate 100 may be silicon-on-insulator (SOI). Hereinafter, a horizontal direction DR1 may be defined as a direction parallel or substantially parallel to an upper side of the first substrate 100. Also, a vertical direction DR2 may be defined as a direction perpendicular or substantially perpendicular to the upper side of the first substrate 100. That is, the vertical direction DR2 may be perpendicular or substantially perpendicular to the horizontal direction DR1.

The first insulating layer 110 may be disposed on the upper side of the first substrate 100. The first insulating layer 110 may be in contact with the upper side of the first substrate 100. Although FIGS. 1 and 2 show that the first insulating layer 110 is conformally formed, the inventive concepts are not limited thereto. The first insulating layer 110 may have a first thickness t1 in the vertical direction DR2.

For example, the first insulating layer 110 may include silicon oxide ($SiO_2$). For example, the first insulating layer 110 may include silicon of a first concentration. Here, the first concentration may mean a ratio of the weight of silicon included in the first insulating layer 110 to a total weight of the first insulating layer 110. For example, the first concentration of silicon included in the first insulating layer 110 may be in a range from 20 wt % to 50 wt %. More suitably, for example, the first concentration of silicon included in the first insulating layer 110 may be in a range from 40 wt % to 50 wt %.

The second insulating layer 120 may be disposed on the upper side of the first insulating layer 110. The second insulating layer 120 may be in contact with the upper side of the first insulating layer 110. Although FIGS. 1 and 2 show that the second insulating layer 120 is formed conformally, the inventive concepts are not limited thereto. The second insulating layer 120 may have a second thickness t2 in the vertical direction DR2. For example, the second thickness t2 of the second insulating layer 120 in the vertical direction DR2 may be smaller than the first thickness t1 of the first insulating layer 110 in the vertical direction DR2. For example, the second thickness t2 of the second insulating layer 120 in the vertical direction DR2 may be in a range of 20 Å to 200 Å.

For example, the second insulating layer 120 may include silicon oxide ($SiO_2$). For example, the second insulating layer 120 may include silicon of a second concentration. Here, the second concentration may mean a ratio of the weight of silicon included in the second insulating layer 120 to a total weight of the second insulating layer 120. The second concentration of silicon included in the second insulating layer 120 may be smaller than the first concentration of silicon included in the first insulating layer 110. For example, the second concentration of silicon included in the second insulating layer 120 may be in a range from 5 wt % to 20 wt %.

A structure may be disposed on the upper side of the second insulating layer 120. For example, the structure may include a third insulating layer 130 and a second substrate 140. The third insulating layer 130 may be disposed on the upper side of the second insulating layer 120. The third insulating layer 130 may be in contact with the upper side of the second insulating layer 120. Although FIGS. 1 and 2 show that the third insulating layer 130 is formed conformally, the inventive concepts are not limited thereto.

The third insulating layer 130 may have a third thickness t3 in the vertical direction DR2. For example, the third thickness t3 of the third insulating layer 130 in the vertical direction DR2 may be greater than the second thickness t2 of the second insulating layer 120 in the vertical direction DR2. For example, although the third thickness t3 of the third insulating layer 130 in the vertical direction DR2 may be the same or substantially the same as the first thickness t1 of the first insulating layer 110 in the vertical direction DR2, the inventive concepts are not limited thereto.

For example, the third insulating layer 130 may include silicon oxide ($SiO_2$). For example, the third insulating layer 130 may include silicon of a third concentration. Here, the third concentration may mean a ratio of the weight of silicon included in the third insulating layer 130 to a total weight of the third insulating layer 130. For example, the third concentration of silicon included in the third insulating layer 130 may be in a range from 20 wt % to 50 wt %. More suitably, for example, the third concentration of silicon included in the third insulating layer 130 may be in a range from 40 wt % to 50 wt %.

The second substrate 140 may be disposed on the upper side of the third insulating layer 130. The second substrate 140 may be in contact with the upper side of the third insulating layer 130. For example, the second substrate 140 may be a wafer. The second substrate 140 may include silicon. That is, the second substrate 140 may be a silicon substrate. However, the inventive concepts are not limited thereto. In some other example embodiments, the second substrate 140 may be silicon-on-insulator (SOI).

A method of manufacturing a semiconductor package according to some example embodiments of the inventive concepts will be explained below with reference to FIGS. 1 to 5.

Figure 3:
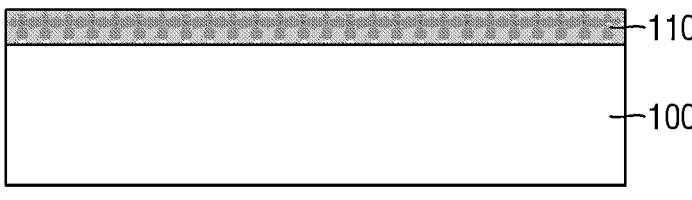
FIGS. 3 to 5 are intermediate step diagrams for explaining a method of manufacturing the semiconductor package shown in FIG. 1.
Figure 3:
Figure 4:
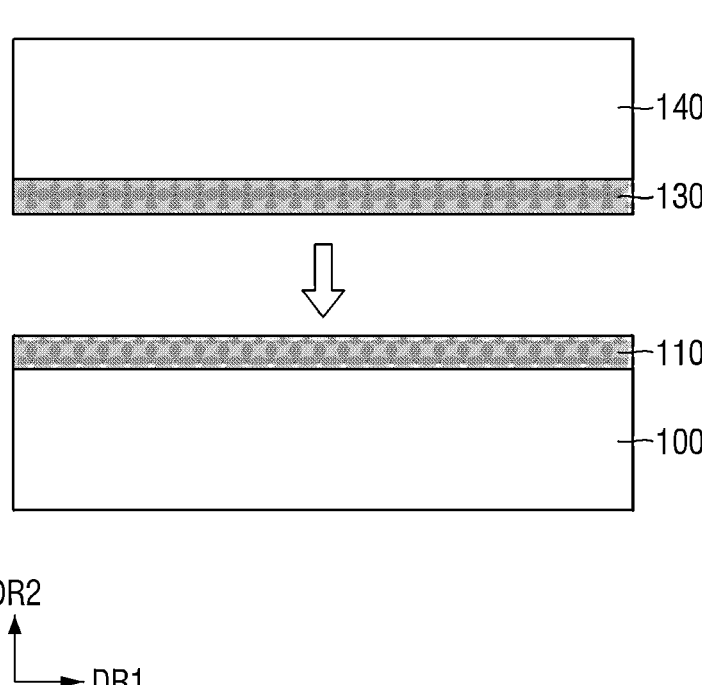
Figure 5:
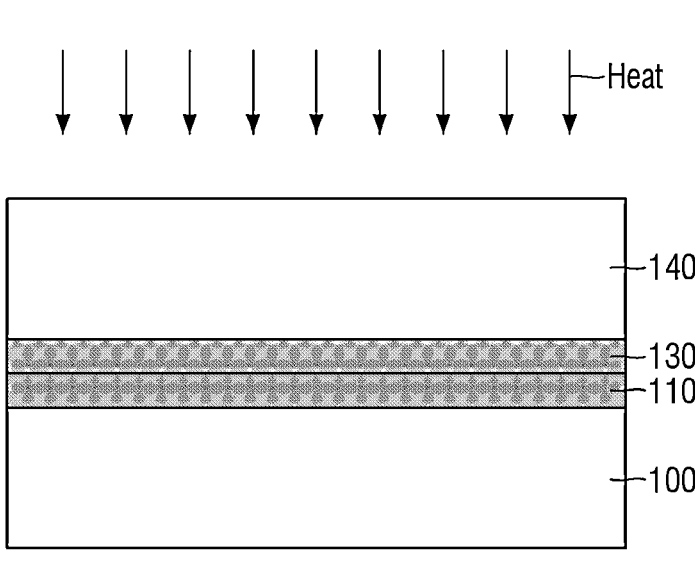
Figure 5:

FIGS. 3 to 5 are intermediate step diagrams for explaining the method of manufacturing the semiconductor package shown in FIG. 1.

Referring to FIG. 3, a first insulating layer 110 may be formed on the upper side of the first substrate 100. For example, the first insulating layer 110 may be formed conformally. For example, the first insulating layer 110 may include silicon oxide ($SiO_2$). For example, the first concentration of silicon included in the first insulating layer 110 may be in a range from 20 wt % to 50 wt %.

Referring to FIG. 4, the third insulating layer 130 may be formed on the surface of the second substrate 140. For example, the third insulating layer 130 may be formed conformally. For example, the third insulating layer 130 may include silicon oxide ($SiO_2$). For example, the third concentration of silicon included in the third insulating layer 130 may be in a range from 20 wt % to 50 wt %. For example, although the thickness of the third insulating layer 130 in the vertical direction DR2 may be formed to be the same or substantially the same as the thickness of the first insulating layer 110 in the vertical direction DR2, the inventive concepts are not limited thereto.

Subsequently, the second substrate 140 may be located on the upper side of the first substrate 100 such that the third insulating layer 130 faces the first insulating layer 110. The third insulating layer 130 may then be attached to the first insulating layer 110.

Referring to FIG. 5, an annealing process (Heat) may be performed. The third insulating layer 130 may be bonded to the first insulating layer 110 through the annealing process (Heat). That is, the second substrate 140 may be bonded onto the upper side of the first substrate 100 through the annealing process (Heat). While the annealing process (Heat) is being performed, silicon oxide ($SiO_2$) included in the first insulating layer 110 and silicon oxide ($SiO_2$) included in the third insulating layer 130 may be combined to generate $H_2O$ as a by-product.

Referring to FIG. 1, the second insulating layer 120 may be formed between the first insulating layer 110 and the third insulating layer 130 after the annealing process (Heat) is performed. For example, the second insulating layer 120 may be formed by partially deforming each of the first insulating layer 110 and the third insulating layer 130.

For example, the second insulating layer 120 may include silicon oxide ($SiO_2$). For example, the second concentration of silicon included in the second insulating layer 120 may be smaller than each of the first concentration of silicon included in the first insulating layer 110 and the third concentration of silicon included in the third insulating layer 130. For example, the second concentration of silicon included in the second insulating layer 120 may be in a range from 5 wt % to 20 wt %.

The second insulating layer 120 may include silicon oxide ($SiO_2$) formed by combining silicon included in each of the first and third insulating layers 110 and 130 with $H_2O$ formed as a by-product while the annealing process (Heat) is being performed. The semiconductor package shown in FIG. 1 may be manufactured through such a manufacturing process.

In the related art, while the bonding process for a wafer including silicon has been performed, $H_2O$ as a by-product may have generated voids on the surface of the silicon oxide layer, on the surface of the silicon oxide layer to be directly bonded. In this case, there has been a problem that voids generated on the bonding joint surface of the wafer may cause a delamination on the bonding joint surface of the wafer.

In the method of manufacturing a semiconductor package according to some example embodiments of the inventive concepts, in the process of bonding the first substrate 100 including silicon, the directly bonded first insulating layer 110 may include a relatively large amount of silicon. After the annealing process (Heat) is performed, $H_2O$ generated as a by-product on the surface of the first insulating layer 110 may be combined with excess silicon included in the first insulating layer 110 to form the second insulating layer 120 including silicon oxide. Accordingly, it is possible to inhibit or prevent voids from occurring on the surface of the first insulating layer 110, thereby improving the bonding reliability of the first substrate 100.

In the semiconductor package according to some example embodiments of the inventive concepts manufactured by such a manufacturing method, the first insulating layer 110 and the second insulating layer 120 may be sequentially disposed on the upper side of the first substrate 100. Each of the first insulating layer 110 and the second insulating layer 120 includes silicon oxide ($SiO_2$), and the second concentration of silicon included in the second insulating layer 120 may be smaller than the first concentration of silicon included in the first insulating layer 110.

A semiconductor package according to some other example embodiments of the inventive concepts will be explained below with reference to FIGS. 6 and 7. Differences from the semiconductor package shown in FIGS. 1 and 2 will be mainly explained.

Figure 6:
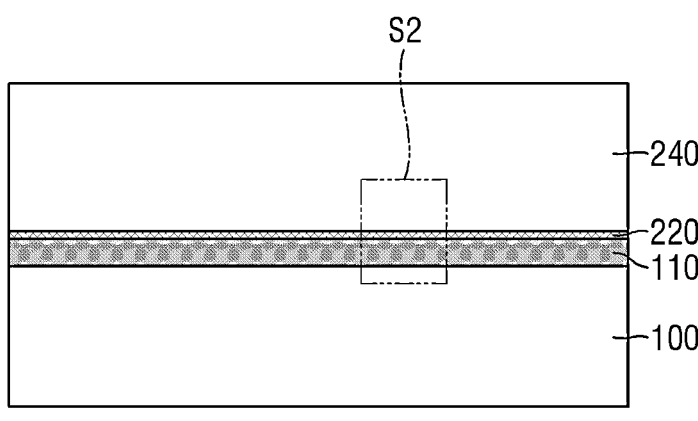
FIG. 6 is a diagram for explaining a semiconductor package according to some other example embodiments of the inventive concepts.

FIG. 6 is a diagram for explaining a semiconductor package according to some other example embodiments of the inventive concepts. FIG. 7 is an enlarged view of a region S2 of FIG. 6.

Figure 7:
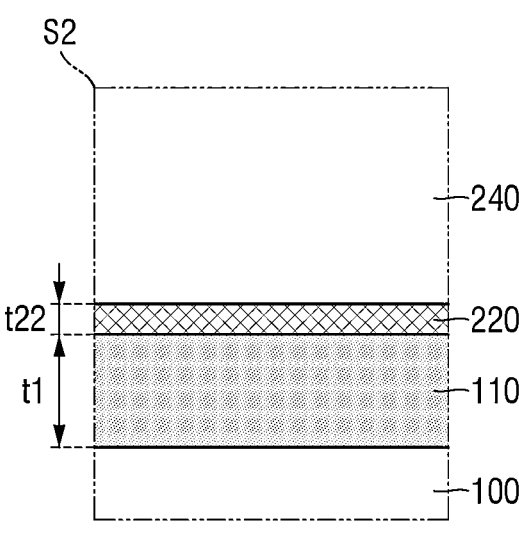
FIG. 7 is an enlarged view of a region S2 of FIG. 6.
Figure 7:
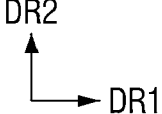

Referring to FIGS. 6 and 7, a semiconductor package according to some other example embodiments of the inventive concepts may include a second insulating layer 220, and a structure disposed on the upper side of the second insulating layer 220.

The second insulating layer 220 may be disposed on the upper side of the first insulating layer 110. The second insulating layer 220 may be in contact with the upper side of the first insulating layer 110. Although FIGS. 6 and 7 show that the second insulating layer 220 is formed conformally, the inventive concepts are not limited thereto. The second insulating layer 220 may have a second thickness t22 in the vertical direction DR2. For example, the second thickness t22 of the second insulating layer 220 in the vertical direction DR2 may be smaller than the first thickness t1 of the first insulating layer 110 in the vertical direction DR2. For example, the second thickness t22 of the second insulating layer 220 in the vertical direction DR2 may be in a range from 20 Å to 200 Å.

For example, the second insulating layer 220 may include silicon oxide ($SiO_2$). For example, the second insulating layer 220 may include silicon of a second concentration. The second concentration of silicon included in the second insulating layer 220 may be smaller than the first concentration of silicon included in the first insulating layer 110. For example, the second concentration of silicon included in the second insulating layer 220 may be in a range from 5 wt % to 20 wt %.

A structure may be disposed on the upper side of the second insulating layer 220. For example, the structure may include a second substrate 240. The second substrate 240 may be disposed on the upper side of the second insulating layer 220. The second substrate 240 may be in contact with the upper side of the second insulating layer 220. For example, second substrate 240 may be a wafer. The second substrate 140 may include silicon. That is, the second substrate 240 may be a silicon substrate.

Hereinafter, a method of manufacturing the semiconductor package according to some other example embodiments of the inventive concepts will be explained with reference to FIGS. 6 to 10.

Figure 8:
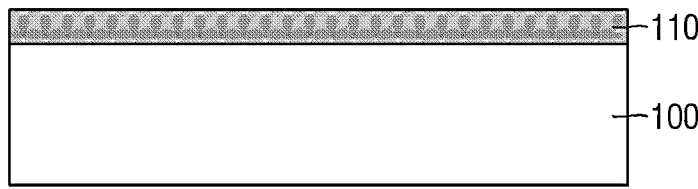
Figure 8:
Figure 9:
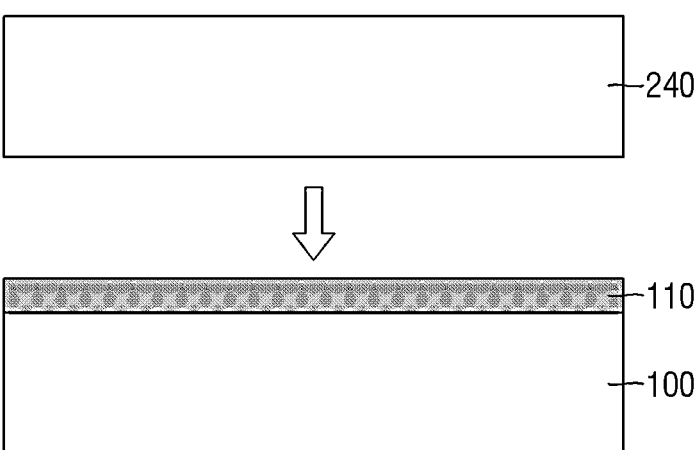
Figure 9:
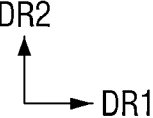
Figure 10:
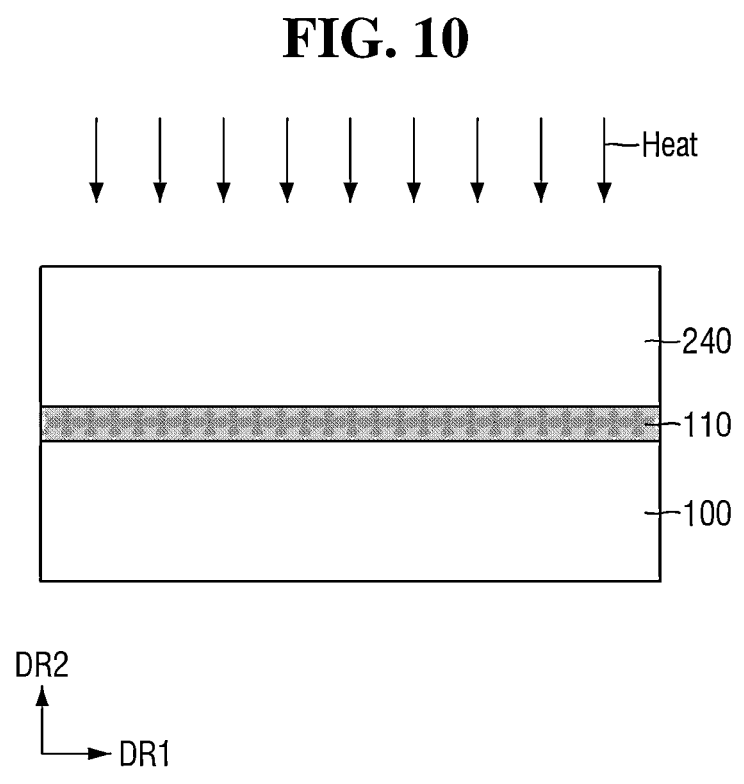

FIGS. 8 to 10 are intermediate step diagrams for explaining the method of manufacturing the semiconductor package shown in FIG. 6.

Referring to FIG. 8, the first insulating layer 110 may be formed on the upper side of the first substrate 100. For example, the first insulating layer 110 may be formed conformally. For example, the first insulating layer 110 may include silicon oxide ($SiO_2$). For example, the first concentration of silicon included in the first insulating layer 110 may be in a range from 20 wt % to 50 wt %.

Referring to FIG. 9, a second substrate 240 may be attached to the upper side of the first insulating layer 110. For example, the second substrate 240 may be a silicon substrate.

Referring to FIG. 10, an annealing process (Heat) may be performed. The second substrate 240 may be bonded to the first insulating layer 110 through the annealing process (Heat). That is, the second substrate 240 may be bonded onto the upper side of the first substrate 100 through the annealing process (Heat). While the annealing process (Heat) is being performed, silicon oxide ($SiO_2$) included in the first insulating layer 110 and silicon included in the second substrate 240 may be combined to generate $H_2O$ as a by-product.

Referring to FIG. 6, the second insulating layer 220 may be formed between the first insulating layer 110 and the second substrate 240 after the annealing process (Heat) is performed. For example, the second insulating layer 220 may be formed by partially deforming each of the first insulating layer 110 and the second substrate 240.

For example, the second insulating layer 220 may include silicon oxide ($SiO_2$). For example, the second concentration of silicon included in the second insulating layer 220 may be smaller than the first concentration of silicon included in the first insulating layer 110. For example, the second concentration of silicon included in the second insulating layer 120 may be in a range from 5 wt % to 20 wt %.

The second insulating layer 220 may include silicon oxide ($SiO_2$) formed by combining silicon included in the first insulating layer 110 and $H_2O$ formed as a by-product while the annealing process (Heat) is being performed. The semiconductor package shown in FIG. 6 may be manufactured through such a manufacturing process.

A semiconductor package according to some other example embodiments of the inventive concepts will now be described below with reference to FIGS. 11 and 12. Differences from the semiconductor package shown in FIGS. 1 and 2 will be mainly explained.

Figure 11:
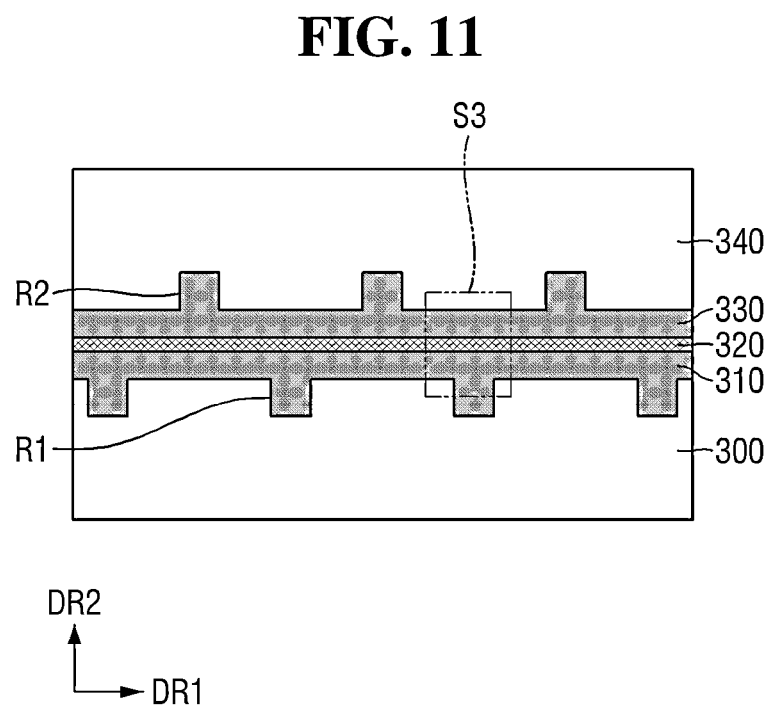

FIG. 11 is a diagram for explaining a semiconductor package according to some other example embodiments of the inventive concepts. FIG. 12 is an enlarged view of a region S3 of FIG. 11.

Figure 12:
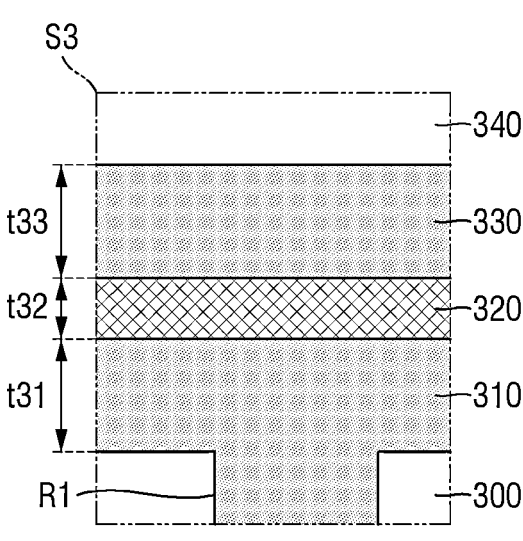
FIG. 12 is an enlarged view of a region S3 of FIG. 11.
Figure 12:

Referring to FIGS. 11 and 12, in the semiconductor package according to some other example embodiments of the inventive concepts, a first recess R1 may be formed on an upper side of a first substrate 300, and a second recess R2 may be formed on a lower side of the second substrate 340.

For example, the structure may be disposed on the upper side of the second insulating layer 320. For example, the structure may include the third insulating layer 330 and the second substrate 340. The third insulating layer 330 may be disposed on the upper side of the second insulating layer 320. The third insulating layer 330 may be in contact with the upper side of the second insulating layer 320.

For example, the first recess R1 may be formed on the surface of the first substrate 300 that faces the second substrate 340. The first recess R1 may be formed to be recessed from the upper side of the first substrate 300 toward the inside of the first substrate 300. The first insulating layer 310 may be disposed on the upper side of the first substrate 300. For example, the first insulating layer 310 may fill the inside of the first recess R1.

For example, the second recess R2 may be formed on the surface of the second substrate 340 that faces the first substrate 300. The second recess R2 may be formed to be recessed from the lower side of the second substrate 340 toward the inside of the second substrate 340. The third insulating layer 330 may be disposed on the lower side of the second substrate 340. For example, the third insulating layer 330 may fill the inside of the second recess R2. The second insulating layer 320 may be disposed between the first insulating layer 310 and the third insulating layer 330. The second insulating layer 320 may be in contact with each of the first insulating layer 310 and the third insulating layer 330.

For example, a second thickness t32 of the second insulating layer 320 in the vertical direction DR2 may be smaller than each of a first thickness t31 of the first insulating layer 310 in the vertical direction DR2 and the third thickness t33 of the third insulating layer 330 in the vertical direction DR2. Here, the first thickness t31 of the first insulating layer 310 in the vertical direction DR2 may be defined as a thickness in the vertical direction DR2 from the uppermost side of the first substrate 300 to the lower side of the second insulating layer 320. Also, the third thickness t33 of the third insulating layer 330 in the vertical direction DR2 may be defined as a thickness in the vertical direction DR2 from the lowermost side of the second substrate 340 to the upper side of the second insulating layer 320. For example, the second thickness t32 of the second insulating layer 320 in the vertical direction DR2 may be in a range from 20 Å to 200 Å.

A semiconductor package according to some other example embodiments of the inventive concepts will be described below with reference to FIGS. 13 and 14. Differences from the semiconductor package shown in FIGS. 1 and 2 will be mainly explained.

Figure 13:
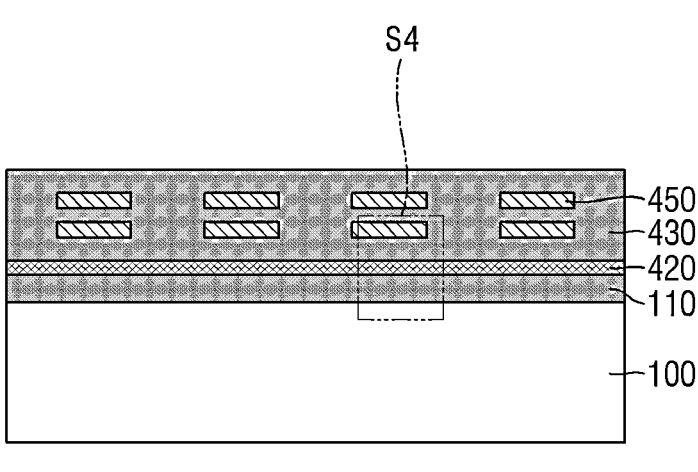
FIG. 13 is a diagram for explaining a semiconductor package according to some other example embodiments of the inventive concepts.

FIG. 13 is a diagram for explaining a semiconductor package according to some other example embodiments of the inventive concepts. FIG. 14 is an enlarged view of a region S4 of FIG. 13.

Figure 14:
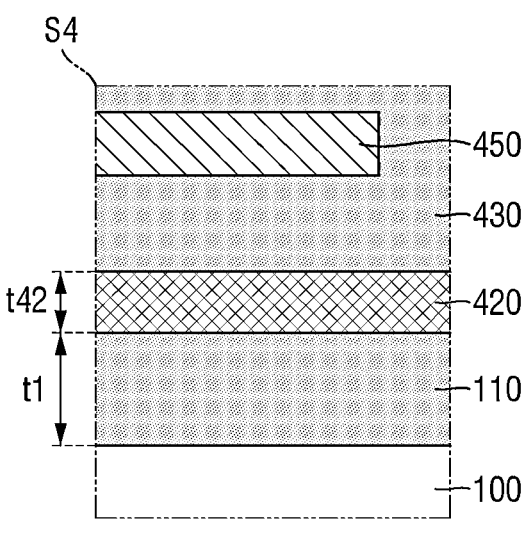
FIG. 14 is an enlarged view of a region S4 of FIG. 13.
Figure 14:
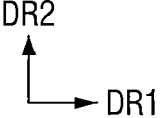

Referring to FIGS. 13 and 14, a semiconductor package according to some other embodiments of the present disclosure may include a second insulating layer 420, and a structure disposed on an upper side of the second insulating layer 420.

The second insulating layer 420 may be disposed on the upper side of the first insulating layer 110. The second insulating layer 420 may be in contact with the upper side of the first insulating layer 110. Although FIGS. 13 and 14 show that the second insulating layer 420 is formed conformally, the inventive concepts are not limited thereto. The second insulating layer 420 may have a second thickness t42 in the vertical direction DR2. For example, the second thickness t42 of the second insulating layer 420 in the vertical direction DR2 may be smaller than the first thickness t1 of the first insulating layer 110 in the vertical direction DR2. For example, the second thickness t42 of the second insulating layer 420 in the vertical direction DR2 may be in a range from 20 Å to 200 Å.

For example, the second insulating layer 420 may include silicon oxide ($SiO_2$). For example, the second insulating layer 420 may include silicon of a second concentration. The second concentration of silicon included in the second insulating layer 420 may be smaller than the first concentration of silicon included in the first insulating layer 110. For example, the second concentration of silicon included in the second insulating layer 420 may be in a range from 5 wt % to 20 wt %.

The structure may be disposed on the upper side of the second insulating layer 420. For example, the structure may include a third insulating layer 430, and a wiring pattern 450 disposed inside the third insulating layer 430. The third insulating layer 430 may be disposed on the upper side of the second insulating layer 420. The third insulating layer 430 may be in contact with the upper side of the second insulating layer 420. The third insulating layer 430 may include silicon oxide ($SiO_2$). For example, the third insulating layer 430 may include silicon of a third concentration. The third concentration of silicon included in the third insulating layer 430 may be greater than the second concentration of silicon included in the second insulating layer 420. For example, the third concentration of silicon included in the third insulating layer 430 may be in a range from 20 wt % to 50 wt %.

The wiring pattern 450 may be disposed inside the third insulating layer 430. For example, the wiring pattern 450 may include a plurality of wirings spaced apart from each other in each of the horizontal direction DR1 and the vertical direction DR2. The wiring pattern 450 may include a conductive material.

Hereinafter, a method of manufacturing a semiconductor package according to some other example embodiments of the inventive concepts will be explained with reference to FIGS. 13 to 17.

Figure 15:
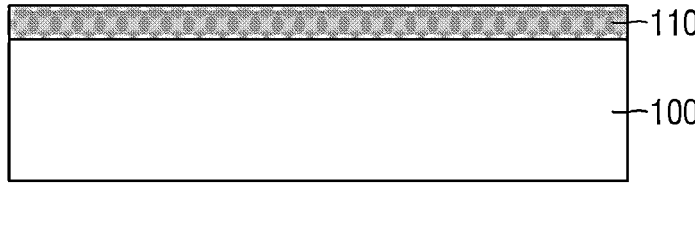
Figure 15:
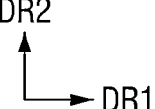
Figure 16:
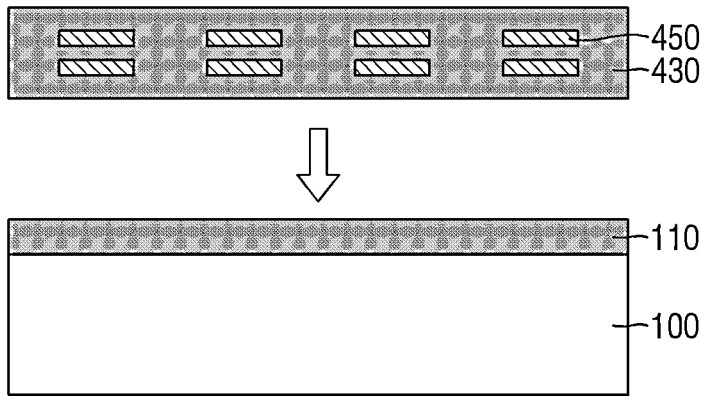
Figure 16:
Figure 17:
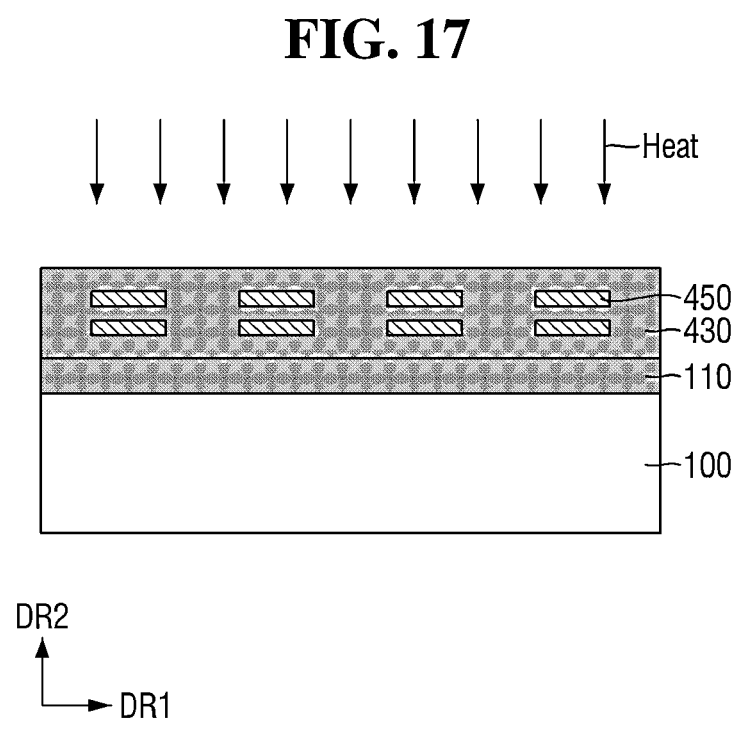

FIGS. 15 to 17 are intermediate step diagrams for explaining the method of manufacturing the semiconductor package shown in FIG. 13.

Referring to FIG. 15, the first insulating layer 110 may be formed on the upper side of the first substrate 100. For example, the first insulating layer 110 may be formed conformally. For example, the first insulating layer 110 may include silicon oxide ($SiO_2$). For example, the first concentration of silicon included in the first insulating layer 110 may be in a range from 20 wt % to 50 wt %.

Referring to FIG. 16, a structure may be attached onto the upper side of the first insulating layer 110. For example, the structure may include a third insulating layer 430, and a wiring pattern 450 disposed inside the third insulating layer 430. The third insulating layer 430 may include silicon oxide ($SiO_2$). For example, the third concentration of silicon included in the third insulating layer 430 may be in a range from 20 wt % to 50 wt %.

Referring to FIG. 17, an annealing process (Heat) may be performed. The third insulating layer 430 may be bonded to the first insulating layer 110 through the annealing process (Heat). That is, the third insulating layer 430 having the wiring pattern 450 formed therein may be bonded to the upper side of the first substrate 100 through the annealing process (Heat). While the annealing process (Heat) is being performed, silicon oxide ($SiO_2$) included in the first insulating layer 110 and silicon oxide ($SiO_2$) included in the third insulating layer 430 may be combined to generate $H_2O$ as a by-product.

Referring to FIG. 13, a second insulating layer 420 may be formed between the first insulating layer 110 and the third insulating layer 430 after the annealing process (Heat) is performed. For example, the second insulating layer 420 may be formed by partially deforming each of the first insulating layer 110 and the third insulating layer 430.

For example, the second insulating layer 420 may include silicon oxide ($SiO_2$). For example, the second concentration of silicon included in the second insulating layer 420 may be smaller than each of the first concentration of silicon included in the first insulating layer 110 and the third concentration of silicon included in the third insulating layer 430. For example, the second concentration of silicon included in the second insulating layer 420 may be in a range from 5 wt % to 20 wt %.

The second insulating layer 420 may include silicon oxide ($SiO_2$) formed by combining silicon included in each of the first and third insulating layers 110 and 430 with $H_2O$ formed as a by-product while the annealing process (Heat) is being performed. The semiconductor package shown in FIG. 13 may be manufactured through such a manufacturing process.

A semiconductor package according to some other example embodiments of the inventive concepts will be explained below with reference to FIGS. 18 and 19. Differences from the semiconductor package shown in FIGS. 1 and 2 will be mainly explained.

Figure 18:
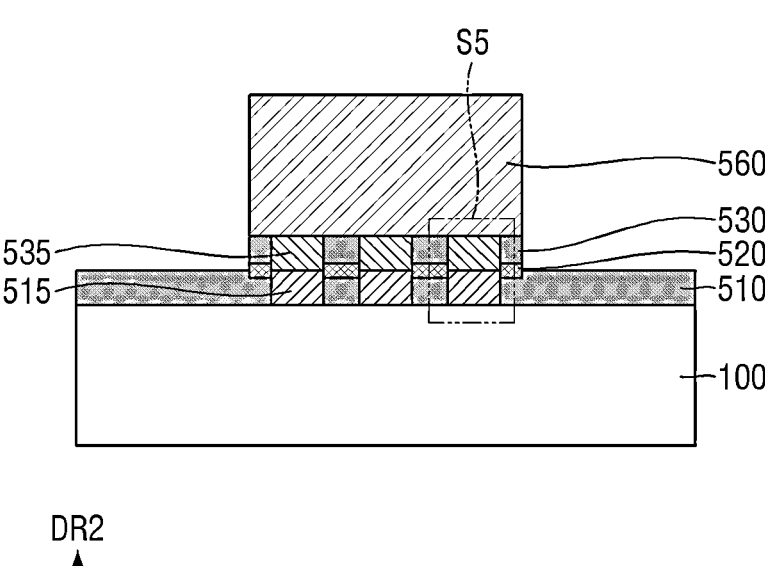
FIG. 18 is a diagram for explaining a semiconductor package according to some other example embodiments of the inventive concepts.

FIG. 18 is a diagram for explaining a semiconductor package according to some other example embodiments of the inventive concepts. FIG. 19 is an enlarged view of a region S5 of FIG. 18.

Figure 19:
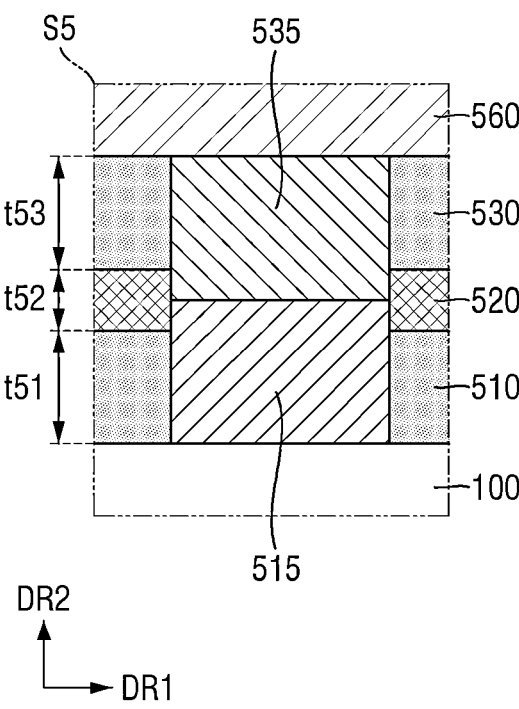
FIG. 19 is an enlarged view of a region S5 of FIG. 18.

Referring to FIGS. 18 and 19, a semiconductor package according to some other example embodiments of the inventive concepts may include a second insulating layer 520, and a structure disposed on the upper side of the second insulating layer 520.

The second insulating layer 520 may be disposed on the upper side of the first insulating layer 510. The second insulating layer 520 may be in contact with the upper side of the first insulating layer 510. Although FIGS. 18 and 19 show that the second insulating layer 520 is formed conformally, the inventive concepts are not limited thereto. For example, the lower side of the second insulating layer 520 may be formed to be lower than the uppermost side of the first insulating layer 510. For example, at least a part of side walls of the second insulating layer 520 may be in contact with the first insulating layer 510.

For example, a width of the second insulating layer 520 in the horizontal direction DR1 may be smaller than a width of the first insulating layer 510 in the horizontal direction DR1. The second insulating layer 520 may have a second thickness t52 in the vertical direction DR2. For example, the second thickness t52 of the second insulating layer 520 in the vertical direction DR2 may be smaller than the first thickness t51 of the first insulating layer 510 in the vertical direction DR2. For example, the second thickness t52 of the second insulating layer 520 in the vertical direction DR2 may be in a range from 20 Å to 200 Å.

For example, the second insulating layer 520 may include silicon oxide ($SiO_2$). For example, the second insulating layer 520 may include silicon of a second concentration. The second concentration of silicon included in the second insulating layer 520 may be smaller than the first concentration of silicon included in the first insulating layer 510. For example, the second concentration of silicon included in the second insulating layer 520 may be in a range from 5 wt % to 20 wt %.

A first conductive terminal 515 may be disposed on the upper side of the first substrate 100. The first conductive terminal 515 may be surrounded by each of the first insulating layer 510 and the second insulating layer 520. For example, the upper side of the first conductive terminal 515 may be formed between the lower side of the second insulating layer 520 and the upper side of the second insulating layer 520. The first conductive terminal 515 may include a conductive material.

A structure may be disposed on the upper side of the second insulating layer 520. For example, the structure may include a third insulating layer 530, a second conductive terminal 535, and a semiconductor chip 560. The third insulating layer 530 may be disposed on the upper side of the second insulating layer 520. The third insulating layer 530 may be in contact with the upper side of the second insulating layer 520. Although FIGS. 18 and 19 show that the third insulating layer 530 is formed conformally, the inventive concepts are not limited thereto.

For example, a width of the third insulating layer 530 in the horizontal direction DR1 may be smaller than a width of the first insulating layer 510 in the horizontal direction DR1. For example, the width of the third insulating layer 530 in the horizontal direction DR1 may be the same or substantially the same as a width of the second insulating layer 520 in the horizontal direction DR1. The third insulating layer 530 may have a third thickness t53 in the vertical direction DR2. For example, the third thickness t53 of the third insulating layer 530 in the vertical direction DR2 may be greater than the second thickness t52 of the second insulating layer 520 in the vertical direction DR2.

The third insulating layer 530 may include silicon oxide ($SiO_2$). For example, the third insulating layer 530 may include silicon of a third concentration. The third concentration of silicon included in the third insulating layer 530 may be greater than the second concentration of silicon included in the second insulating layer 520. For example, the third concentration of silicon included in the third insulating layer 530 may be in a range from 20 wt % to 50 wt %.

The semiconductor chip 560 may be disposed on the upper side of the third insulating layer 530. The semiconductor chip 560 may be in contact with the upper side of the third insulating layer 530. For example, the width of the semiconductor chip 560 in the horizontal direction DR1 may be the same or substantially the same as the width of the third insulating layer 530 in the horizontal direction DR1. For example, the semiconductor chip 560 may be a logic semiconductor chip. For example, the semiconductor chip 560 may be an application processor (AP), such as a CPU (Central Processing Unit), a GPU (Graphic Processing Unit), a FPGA (Field-Programmable Gate Array), a digital signal processor, an encryption processor, a micro-processor, a micro-controller, and an ASIC (Application-Specific IC), but example embodiments are not limited thereto.

For example, the semiconductor chip 560 may be a memory semiconductor chip. For example, the semiconductor chip 560 may be a volatile memory such as a DRAM (dynamic random access memory) or a SRAM (static random access memory), or a non-volatile memory such as a flash memory, a PRAM (Phase-change Random Access Memory), a MRAM (Magnetoresistive Random Access Memory), a FeRAM (Ferroelectric Random Access Memory) or a RRAM (Resistive Random Access Memory), but example embodiments are not limited thereto.

The second conductive terminal 535 may be disposed on a lower side of the semiconductor chip 560. The second conductive terminal 535 may overlap the first conductive terminal 515 in the vertical direction DR2. The second conductive terminal 535 may be connected to the first conductive terminal 515. For example, the semiconductor chip 560 may be electrically connected to the first substrate 100 through the second conductive terminal 535 and the first conductive terminal 515.

The second conductive terminal 535 may be surrounded by each of the second insulating layer 520 and the third insulating layer 530. For example, a lower side of the second conductive terminal 535 may be formed between the lower side of the second insulating layer 520 and the upper side of the second insulating layer 520. The second conductive terminal 535 may include a conductive material.

Hereinafter, a method of manufacturing the semiconductor package according to some other example embodiments of the inventive concepts will be explained with reference to FIGS. 18 to 22.

Figure 20:
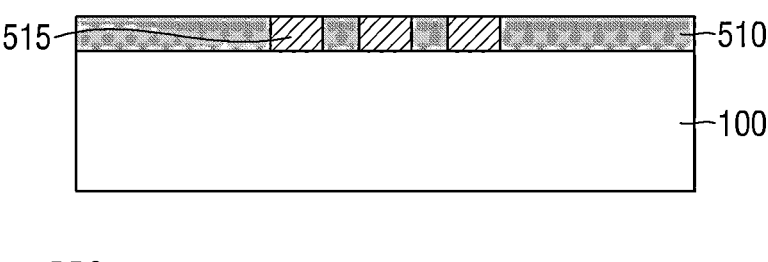
Figure 21:
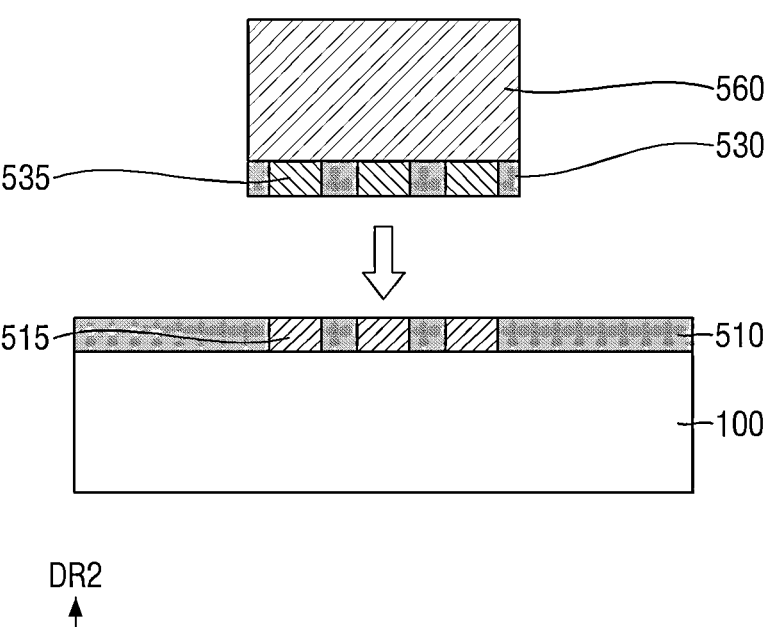
Figure 22:
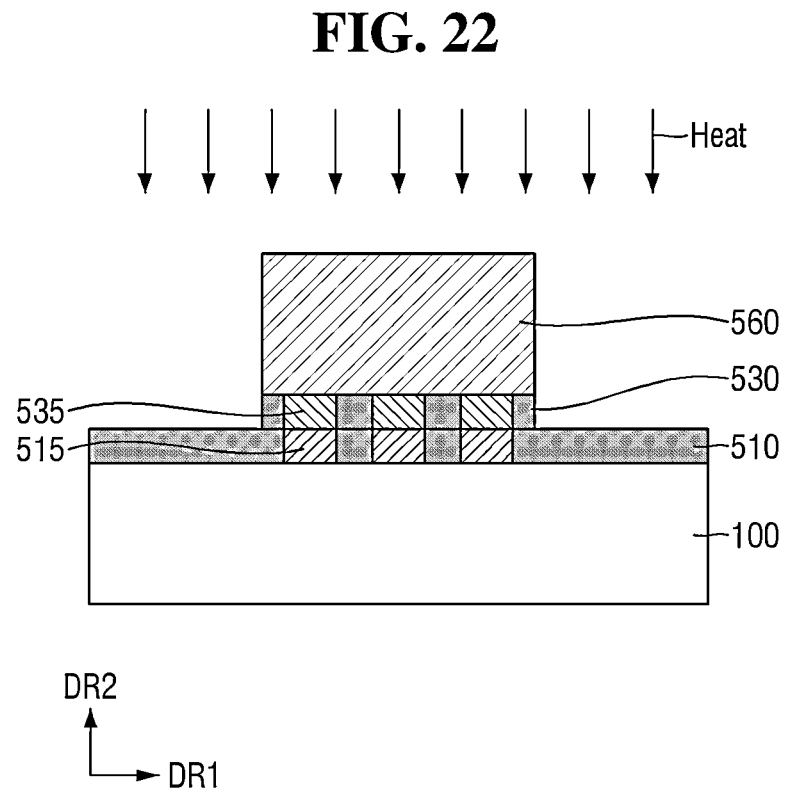

FIGS. 20 to 22 are intermediate step diagrams for explaining the method of manufacturing the semiconductor package shown in FIG. 18.

Referring to FIG. 20, a first insulating layer 510 may be formed on the upper side of the first substrate 100. For example, the first insulating layer 510 may be formed conformally. For example, the first insulating layer 510 may include silicon oxide ($SiO_2$). For example, the first concentration of silicon included in the first insulating layer 510 may be in a range from 20 wt % to 50 wt %. The first conductive terminal 515 may be formed inside the first insulating layer 510 on the upper side of the first substrate 100. The first conductive terminal 515 may include a conductive material.

Referring to FIG. 21, a structure may be attached onto the upper side of the first insulating layer 510. For example, the structure may include a third insulating layer 530, a second conductive terminal 535 and a semiconductor chip 560. The third insulating layer 530 may be formed on the lower side of the semiconductor chip 560. The third insulating layer 430 may include silicon oxide ($SiO_2$). For example, the third concentration of silicon included in the third insulating layer 430 may be in a range from 20 wt % to 50 wt %.

The second conductive terminal 535 may be formed inside the third insulating layer 530 on the lower side of the semiconductor chip 560. The second conductive terminal 535 may include a conductive material. In the structure, the third insulating layer 530 may be located to face the first insulating layer 510 and attached to the first insulating layer 510.

Referring to FIG. 22, the annealing process (Heat) may be performed. The third insulating layer 530 may be bonded to the first insulating layer 510 through the annealing process (Heat). That is, the semiconductor chip 560 may be bonded to the upper side of the first substrate 100 through the annealing process (Heat). The second conductive terminal 535 may be bonded to be in contact with the first conductive terminal 515. While the annealing process (Heat) is being performed, silicon oxide ($SiO_2$) included in the first insulating layer 510 and silicon oxide ($SiO_2$) included in the third insulating layer 530 may be combined to generate $H_2O$ as a by-product.

Referring to FIG. 18, the second insulating layer 520 may be formed between the first insulating layer 510 and the third insulating layer 530 after the annealing process (Heat) is performed. For example, the second insulating layer 520 may be formed by partially deforming each of the first insulating layer 510 and the third insulating layer 530. For example, the width of the second insulating layer 520 in the horizontal direction DR1 may be smaller than the width of the first insulating layer 510 in the horizontal direction DR1. For example, the width of the second insulating layer 520 in the horizontal direction DR1 may be the same or substantially the same as the width of the third insulating layer 530 in the horizontal direction DR1.

For example, the second insulating layer 520 may include silicon oxide ($SiO_2$). For example, the second concentration of silicon included in the second insulating layer 520 may be smaller than each of the first concentration of silicon included in the first insulating layer 510 and the third concentration of silicon included in the third insulating layer 530. For example, the second concentration of silicon included in the second insulating layer 520 may be in a range from 5 wt % to 20 wt %.

The second insulating layer 520 may include silicon oxide ($SiO_2$) by combining silicon included in each of the first and third insulating layers 510 and 530 with $H_2O$ formed as a by-product while the annealing process (Heat) is being performed. The semiconductor package shown in FIG. 18 may be manufactured through such a manufacturing process.

A semiconductor package according to some other example embodiments of the inventive concepts be explained below with reference to FIGS. 23 and 24. Differences from the semiconductor package shown in FIGS. 1 and 2 will be mainly explained.

Figure 23:
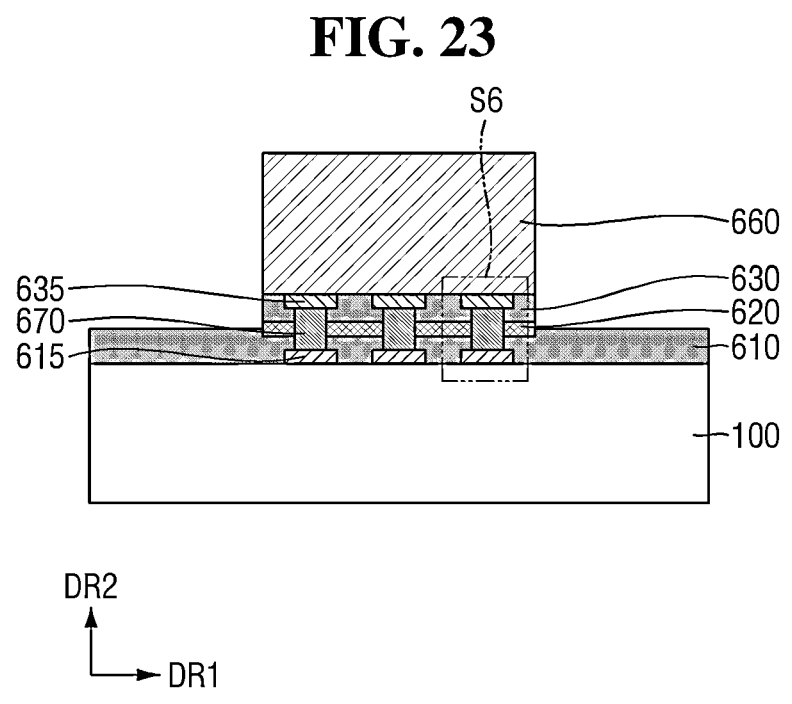

FIG. 23 is a diagram for explaining a semiconductor package according to some other example embodiments of the inventive concepts. FIG. 24 is an enlarged view of a region S6 of FIG. 23.

Figure 24:
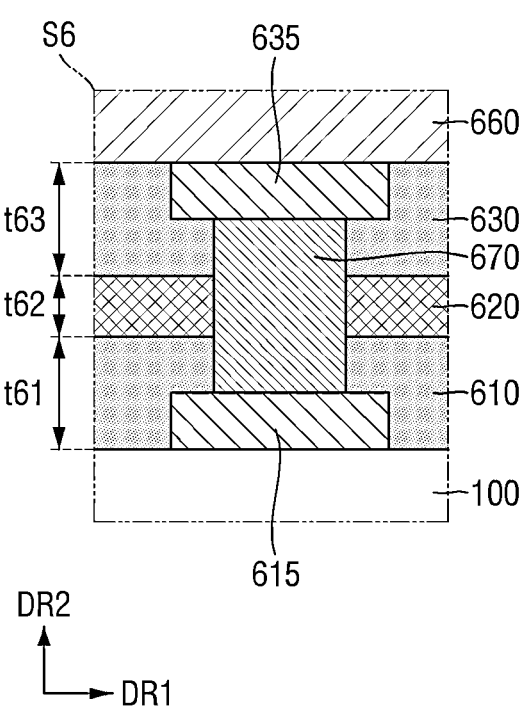
FIG. 24 is an enlarged view of a region S6 of FIG. 23.

Referring to FIGS. 23 and 24, the semiconductor package according to some other example embodiments of the inventive concepts may include a second insulating layer 620, and a structure disposed on the upper side of the second insulating layer 620.

The second insulating layer 620 may be disposed on the upper side of the first insulating layer 610. The second insulating layer 620 may be in contact with the upper side of the first insulating layer 610. Although FIGS. 23 and 24 show that the second insulating layer 620 is formed conformally, the inventive concepts are not limited thereto. For example, the lower side of the second insulating layer 620 may be formed to be lower than the uppermost side of the first insulating layer 610. For example, at least a part of side walls of the second insulating layer 620 may be in contact with the first insulating layer 610.

For example, the width of the second insulating layer 620 in the horizontal direction DR1 may be smaller than the width of the first insulating layer 610 in the horizontal direction DR1. The second insulating layer 620 may have a second thickness t62 in the vertical direction DR2. For example, the second thickness t62 of the second insulating layer 620 in the vertical direction DR2 may be smaller than the first thickness t61 of the first insulating layer 610 in the vertical direction DR2. For example, the second thickness t62 of the second insulating layer 620 in the vertical direction DR2 may be in a range from 20 Å to 200 Å.

For example, the second insulating layer 620 may include silicon oxide ($SiO_2$). For example, the second insulating layer 620 may include silicon of a second concentration. The second concentration of silicon included in the second insulating layer 620 may be smaller than the first concentration of silicon included in the first insulating layer 610. For example, the second concentration of silicon included in the second insulating layer 620 may be in a range from 5 wt % to 20 wt %.

A first conductive terminal 615 may be disposed on the upper side of the first substrate 100. The first conductive terminal 615 may be surrounded by the first insulating layer 610. For example, the upper side of the first conductive terminal 615 may be in contact with the first insulating layer 610. First conductive terminal 615 may include a conductive material.

The structure may be disposed on the upper side of the second insulating layer 620. For example, the structure may include a third insulating layer 630, a second conductive terminal 635, and a semiconductor chip 660. The third insulating layer 630 may be disposed on the upper side of the second insulating layer 620. The third insulating layer 630 may be in contact with the upper side of the second insulating layer 620. Although FIGS. 23 and 24 show that the third insulating layer 630 is formed conformally, the inventive concepts are not limited thereto.

For example, the width of the third insulating layer 630 in the horizontal direction DR1 may be smaller than the width of the first insulating layer 610 in the horizontal direction DR1. For example, the width of the third insulating layer 630 in the horizontal direction DR1 may be the same or substantially the same as the width of the second insulating layer 620 in the horizontal direction DR1. The third insulating layer 630 may have a third thickness t63 in the vertical direction DR2. For example, the third thickness t63 of the third insulating layer 630 in the vertical direction DR2 may be greater than the second thickness t62 of the second insulating layer 620 in the vertical direction DR2.

The third insulating layer 630 may include silicon oxide ($SiO_2$). For example, third insulating layer 630 may include silicon of a third concentration. The third concentration of silicon included in the third insulating layer 630 may be greater than the second concentration of silicon included in the second insulating layer 620. For example, the third concentration of silicon included in the third insulating layer 630 may be in a range from 20 wt % to 50 wt %.

The semiconductor chip 660 may be disposed on the upper side of the third insulating layer 630. The semiconductor chip 660 may be in contact with the upper side of the third insulating layer 630. For example, the width of the semiconductor chip 660 in the horizontal direction DR1 may be the same or substantially the same as the width of the third insulating layer 630 in the horizontal direction DR1. For example, the semiconductor chip 660 may be a logic semiconductor chip or a memory semiconductor chip.

A second conductive terminal 635 may be disposed on the lower side of the semiconductor chip 660. The second conductive terminal 635 may overlap the first conductive terminal 615 in the vertical direction DR2. The second conductive terminal 635 may be surrounded by the third insulating layer 530. For example, the lower side of the second conductive terminal 635 may be in contact with the third insulating layer 630. The second conductive terminal 635 may include a conductive material.

A connecting terminal 670 may be disposed between the first conductive terminal 615 and the second conductive terminal 635. The connecting terminal 670 may connect the first conductive terminal 615 and the second conductive terminal 635. The connecting terminal 670 may be surrounded by each of the first insulating layer 610, the second insulating layer 620, and the third insulating layer 630. The connecting terminal 670 may include a conductive material.

For example, the semiconductor chip 660 may be electrically connected to the first substrate 100 through the second conductive terminal 635, the connecting terminal 670 and the first conductive terminal 615.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FGPA), a System-on-Chip (SoC), a programmable logic unit, a microprocessor, application-specific integrated circuit (ASIC), etc.

Although some example embodiments of the inventive concepts have been described above with reference to the accompanying drawings, the inventive concepts are not limited to the above example embodiments, and may be manufactured in various forms. Those skilled in the art will appreciate that the inventive concepts may be embodied in other specific forms without changing the scope of the inventive concepts. Accordingly, the above-described example embodiments are to be considered as illustrative and not restrictive in all respects.

What is claimed is:

1. A semiconductor package comprising:
a first substrate including silicon;
a first insulating layer in contact with the first substrate on the first substrate, the first insulating layer including silicon oxide, the first insulating layer having a first concentration of silicon;
a second insulating layer in contact with the first insulating layer on the first insulating layer, the second insulating layer including silicon oxide, the second insulating layer having a second concentration of silicon, the second concentration lower than the first concentration; and
a structure on the second insulating layer,
wherein the first concentration is a ratio of a weight of silicon in the first insulating layer to a total weight of the first insulating layer,
wherein the second concentration is a ratio of a weight of silicon in the second insulating layer to a total weight of the second insulating layer, and
wherein the first concentration is in a range from 20 wt % to 50 wt %.

2. The semiconductor package of claim 1, wherein a thickness of the second insulating layer is smaller than a thickness of the first insulating layer.

3. The semiconductor package of claim 1, wherein a thickness of the second insulating layer is in a range from 20 Å to 200 Å.

4. The semiconductor package of claim 1, wherein the second concentration is in a range from 5 wt % to 20 wt %.

5. The semiconductor package of claim 1, wherein the structure includes a third insulating layer in contact with the second insulating layer on the second insulating layer, the third insulating layer including silicon oxide, the third insulating layer having a third concentration higher than the second concentration, and
a second substrate in contact with the third insulating layer on the third insulating layer, the second substrate including silicon.

6. The semiconductor package of claim 5, further comprising:
a first recess on a surface of the first substrate facing the second substrate, the first recess recessed toward an inside of the first substrate; and
a second recess on a surface of the second substrate facing the first substrate, the second recess recessed toward an inside of the second substrate,
wherein the first insulating layer fills an inside of the first recess, and the third insulating layer fills an inside of the second recess.

7. The semiconductor package of claim 1, wherein
the structure includes a second substrate in contact with the second insulating layer on the second insulating layer, and
the second substrate includes silicon.

8. The semiconductor package of claim 1, wherein the structure includes
a third insulating layer in contact with the second insulating layer on the second insulating layer, the third insulating layer including silicon oxide, the third insulating layer having a third concentration of silicon, the third concentration higher than the second concentration, and
a wiring pattern inside the third insulating layer, the wiring pattern including a conductive material.

9. The semiconductor package of claim 1, wherein the structure includes
a third insulating layer in contact with the second insulating layer on the second insulating layer, the third insulating layer including silicon oxide, the third insulating layer having a third concentration of silicon, the third concentration higher than the second concentration, and
a semiconductor chip in contact with the third insulating layer on the third insulating layer.

10. The semiconductor package of claim 9, further comprising:
a first conductive terminal surrounded by each of the first insulating layer and the second insulating layer, the first conductive terminal in contact with the first substrate; and
a second conductive terminal surrounded by each of the second insulating layer and the third insulating layer, the second conductive terminal in contact with the semiconductor chip, and the second conductive terminal connected to the first conductive terminal.

11. The semiconductor package of claim 9, further comprising:
a first conductive terminal surrounded by the first insulating layer, the first conductive terminal in contact with the first substrate;
a second conductive terminal surrounded by the third insulating layer, the second conductive terminal in contact with the semiconductor chip; and
a connecting terminal connecting the first conductive terminal and the second conductive terminal, the connecting terminal surrounded by each of the first insulating layer, the second insulating layer and the third insulating layer.

12. The semiconductor package of claim 9, wherein at least a part of side walls of the second insulating layer is in contact with the first insulating layer.

13. A semiconductor package comprising:
a first substrate including silicon;
a first insulating layer in contact with the first substrate on the first substrate, the first insulating layer including silicon oxide, the first insulating layer having a first concentration of silicon;
a second insulating layer in contact with the first insulating layer on the first insulating layer, the second insulating layer including silicon oxide, the second insulating layer having a second concentration of silicon, the second concentration lower than the first concentration;
a third insulating layer in contact with the second insulating layer on the second insulating layer, the third insulating layer including silicon oxide, the third insulating layer having a third concentration of silicon, the third concentration higher than the second concentration; and
a structure disposed on the third insulating layer,
    wherein the first concentration is a ratio of a weight of silicon included in the first insulating layer to a total weight of the first insulating layer,
    wherein the second concentration is a ratio of a weight of silicon included in the second insulating layer to a total weight of the second insulating layer, and
    wherein the third concentration is a ratio of a weight of silicon included in the third insulating layer to a total weight of the third insulating layer.

14. The semiconductor package of claim 13, wherein each of the first concentration and third concentration is in a range from 20 wt % to 50 wt %, and
the second concentration is in a range from 5 wt % to 20 wt %.

15. The semiconductor package of claim 13, wherein a thickness of the second insulating layer is smaller than each of a thickness of the first insulating layer and a thickness of the third insulating layer.

16. The semiconductor package of claim 13, wherein
the structure includes a second substrate in contact with the third insulating layer on the third insulating layer, and
the structure includes silicon.

17. The semiconductor package of claim 13, further comprising:
a wiring pattern inside the third insulating layer, the wiring pattern including a conductive material.

18. The semiconductor package of claim 13, further comprising:
a semiconductor chip in contact with the third insulating layer on the third insulating layer.

19. The semiconductor package of claim 18, wherein each of a width of the second insulating layer in a horizontal direction and a width of the third insulating layer in the horizontal direction is smaller than a width of the first insulating layer in the horizontal direction.

20. A semiconductor package comprising:
a first substrate including silicon;
a first insulating layer in contact with the first substrate on the first substrate, the first insulating layer including silicon oxide, the first insulating layer having a first concentration of silicon;
a second insulating layer in contact with the first insulating layer on the first insulating layer, the second insulating layer including silicon oxide, the second insulating layer having a second concentration of silicon, the second concentration lower than the first concentration;
a third insulating layer in contact with the second insulating layer on the second insulating layer, the third insulating layer including silicon oxide, the third insulating layer having a third concentration of silicon, the third concentration higher than the second concentration; and
a second substrate in contact with the third insulating layer on the third insulating layer, the second substrate including silicon,
    wherein the first concentration is a ratio of a weight of silicon included in the first insulating layer to a total weight of the first insulating layer,
    wherein the second concentration is a ratio of a weight of silicon included in the second insulating layer to a total weight of the second insulating layer,
    wherein the third concentration is a ratio of a weight of silicon included in the third insulating layer to a total weight of the third insulating layer,
    wherein a thickness of the second insulating layer is smaller than each of a thickness of the first insulating layer and a thickness of the third insulating layer,
    wherein each of the first concentration and the third concentration is in a range from 20 wt % to 50 wt %, and
    wherein the second concentration is in a range from 5 wt % to 20 wt %.

* * * * *